(12) United States Patent
Chen et al.

(10) Patent No.: US 11,737,265 B2
(45) Date of Patent: Aug. 22, 2023

(54) MANUFACTURING METHOD OF SEMICONDUCTOR MEMORY DEVICE

(71) Applicant: UNITED MICROELECTRONICS CORP., Hsin-Chu (TW)

(72) Inventors: Chih-Jung Chen, Hsinchu County (TW); Hung-Hsun Shuai, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 17/888,511

(22) Filed: Aug. 16, 2022

(65) Prior Publication Data

US 2022/0415913 A1 Dec. 29, 2022

Related U.S. Application Data

(62) Division of application No. 17/005,285, filed on Aug. 27, 2020, now Pat. No. 11,456,305.

(30) Foreign Application Priority Data

Jul. 29, 2020 (CN) .......................... 202010742405.8

(51) Int. Cl.
| | | |
|---|---|---|
| *H01L 21/00* | (2006.01) | |
| *H10B 41/30* | (2023.01) | |
| *H10B 41/10* | (2023.01) | |
| *H10B 43/10* | (2023.01) | |
| *H10B 43/30* | (2023.01) | |

(52) U.S. Cl.
CPC ............ *H10B 41/30* (2023.02); *H10B 41/10* (2023.02); *H10B 43/10* (2023.02); *H10B 43/30* (2023.02)

(58) Field of Classification Search
CPC ........ H10B 41/30; H10B 41/10; H10B 43/30; H10B 43/10
See application file for complete search history.

(56) References Cited

U.S. PATENT DOCUMENTS

| | | |
|---|---|---|
| 5,429,970 A | 7/1995 | Hong |
| 5,705,415 A | 1/1998 | Orlowski |
| 6,372,564 B1 | 4/2002 | Lee |
| 6,639,269 B1 | 10/2003 | Hofmann |
| 6,744,097 B2 | 6/2004 | Yoo |
| 6,818,948 B2 | 11/2004 | Lin |
| 7,214,579 B2 | 5/2007 | Widdershoven |
| 7,253,055 B2 | 8/2007 | Mokhlesi |
| 8,076,205 B2 | 12/2011 | Maekawa |
| 11,456,305 B2 * | 9/2022 | Chen ..................... H10B 43/10 |
| 2019/0363096 A1 | 11/2019 | Zhang |

* cited by examiner

*Primary Examiner* — Richard A Booth
(74) *Attorney, Agent, or Firm* — Winston Hsu

(57) ABSTRACT

A semiconductor memory device includes a substrate, an isolation layer, a trench, a semiconductor active structure, and a floating gate electrode. The isolation layer is disposed on the substrate. The trench penetrates through the isolation layer and exposes a part of the substrate. The semiconductor active structure is disposed in the trench, and the floating gate electrode is disposed on the semiconductor active structure. A manufacturing method of the semiconductor memory device includes the following steps. The isolation layer is formed on the substrate. The trench is formed penetrating through the isolation layer and exposing a part of the substrate. The semiconductor active structure is formed in the trench. The floating gate electrode is formed on the semiconductor active structure.

10 Claims, 10 Drawing Sheets

MANUFACTURING METHOD OF SEMICONDUCTOR MEMORY DEVICE

CROSS REFERENCE TO RELATED APPLICATIONS

This application is a division of U.S. application Ser. No. 17/005,285, filed on Aug. 27, 2020. The content of the application is incorporated herein by reference.

BACKGROUND OF THE INVENTION

1. Field of the Invention

The present invention relates to a semiconductor memory device and a manufacturing method thereof, and more particularly, to a semiconductor memory device including a semiconductor active structure disposed in a trench and a manufacturing method thereof.

2. Description of the Prior Art

Semiconductor memory devices are used in computer and electronics industries as a means for retaining digital information or data. Typically, the semiconductor memory devices are divided into volatile and non-volatile memory devices. The non-volatile memory devices, which can retain data even when the power supply is interrupted, have been widely employed. As one kind of the non-volatile memory technology, a SONOS memory structure is to build a silicon nitride layer sandwiched between two silicon oxide layers for serving as the charge trapping layer while the two silicon oxide layers respectively serve as a charge tunnel layer and a charge block layer. This oxide-nitride-oxide (ONO) multilayered structure is disposed on a semiconductor substrate, a silicon floating gate may be disposed on the ONO multilayered structure, and thus a SONOS memory structure is constructed.

Since the microprocessors have become more powerful, requirement to memory devices of large-capacity and low-cost is raised. To satisfy such trend and achieve challenge of high integration in semiconductor devices, memory miniaturization is kept on going, and thus fabrication process of memory structure is getting complicated. It is difficult to effectively enhance the manufacturing yield because of many issues occurred correspondingly.

SUMMARY OF THE INVENTION

A semiconductor memory device and a manufacturing method thereof are provided in the present invention. A semiconductor active structure is formed in a trench penetrating through an isolation layer for avoiding an influence of an edge shape of a shallow trench isolation structure formed in a semiconductor material on a formation of a floating gate electrode formed subsequently, and the purpose of manufacturing yield enhancement may be achieved accordingly.

According to an embodiment of the present invention, a semiconductor memory device is provided. The semiconductor memory device includes a substrate, an isolation layer, a trench, a semiconductor active structure, and a floating gate electrode. The isolation layer is disposed on the substrate. The trench penetrates through the isolation layer and exposes a part of the substrate. The semiconductor active structure is disposed in the trench. The floating gate electrode is disposed on the semiconductor active structure.

According to an embodiment of the present invention, a manufacturing method of a semiconductor memory device is provided. The manufacturing method includes the following steps. An isolation layer is formed on a substrate. A trench is formed penetrating through the isolation layer and exposing a part of the substrate. A semiconductor active structure is formed in the trench. A floating gate electrode is formed on the semiconductor active structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 4-17 are schematic drawings illustrating a manufacturing method of a semiconductor memory device according to the second embodiment of the present invention, wherein FIG. 5 is a schematic drawing in a step subsequent to FIG. 4, FIG. 6 is a cross-sectional diagram taken along a line B-B' in FIG. 5, FIG. 7 is a cross-sectional diagram taken along a line C-C' in FIG. 5, FIG. 8 is a schematic drawing in a step subsequent to FIG. 7, FIG. 9 is a schematic drawing in a step subsequent to FIG. 8, FIG. 10 is a cross-sectional diagram taken along a line D-D' in FIG. 9, FIG. 11 is a schematic drawing in a step subsequent to FIG. 9, FIG. 12 is a cross-sectional diagram taken along a line E-E' in FIG. 11, FIG. 13 is a schematic drawing in a step subsequent to FIG. 12, FIG. 14 is a schematic drawing in a step subsequent to FIG. 13, FIG. 15 is a cross-sectional diagram taken along a line F-F' in FIG. 14, FIG. 16 is a schematic drawing in a step subsequent to FIG. 14, and FIG. 17 is a schematic drawing in a step subsequent to FIG. 16.

DETAILED DESCRIPTION

Figure 1:
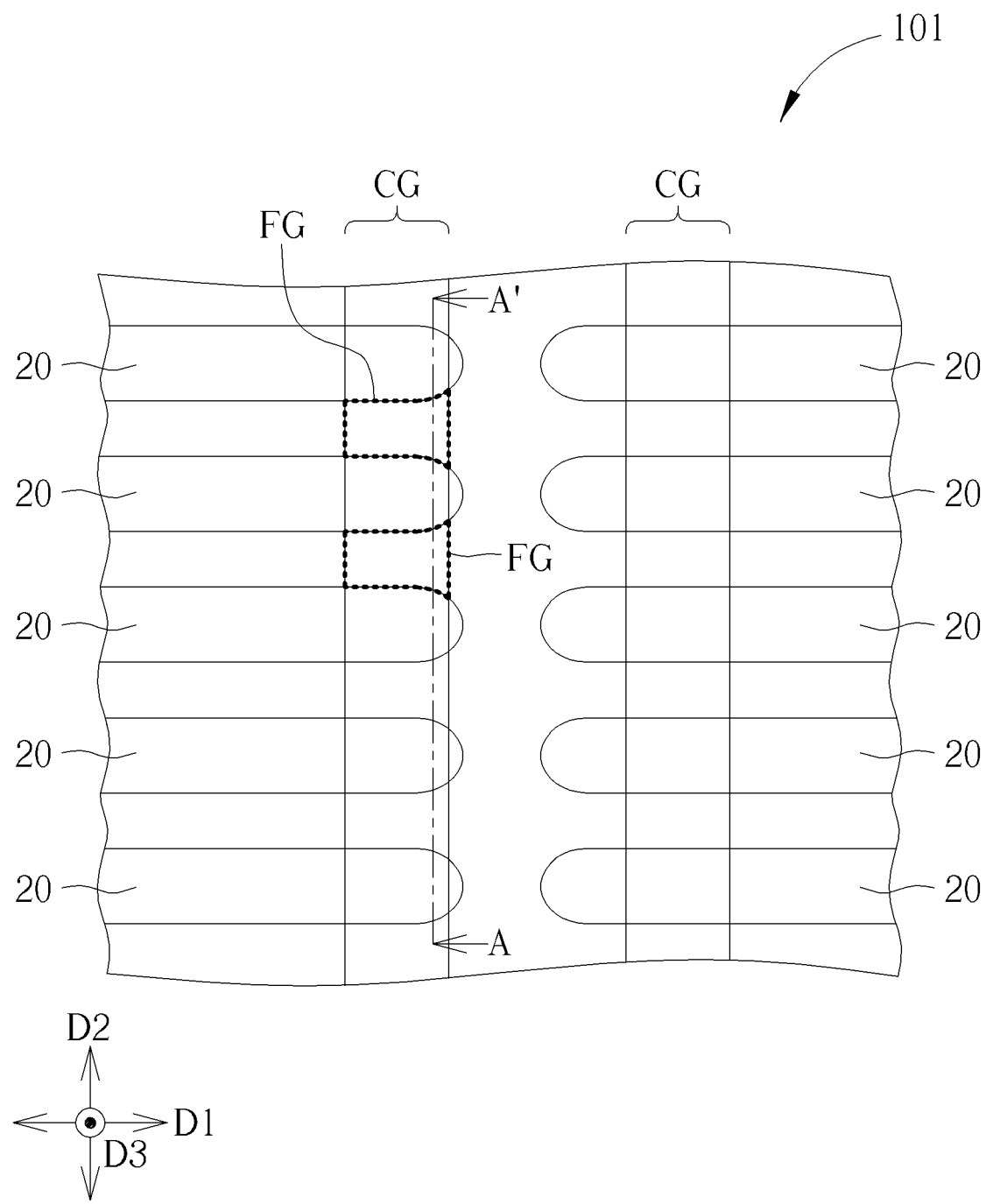
FIG. 1 is a schematic drawing illustrating a top view of a semiconductor memory device according to a first embodiment of the present invention.

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "etch" is used herein to describe the process of patterning a material layer so that at least a portion of the material layer after etching is retained. For example, it is to be understood that the method of etching silicon involves patterning a photoresist layer over silicon and then removing silicon from the area that is not protected by the photoresist layer. Thus, after the etching process is complete, the silicon protected by the area of the photoresist layer will remain. In another example, the term "etch" may also refer to a method that does not use a photoresist, but leaves at least a portion of the material layer after the etch process is complete.

The above description may be used to distinguish between "etching" and "removal". When "etching" a material layer, at least a portion of the material layer is retained after the end of the treatment. In contrast, when the material layer is "removed", substantially all the material layer is removed in the process. However, in some embodiments, "removal" is considered to be a broad term and may include etching.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 2:
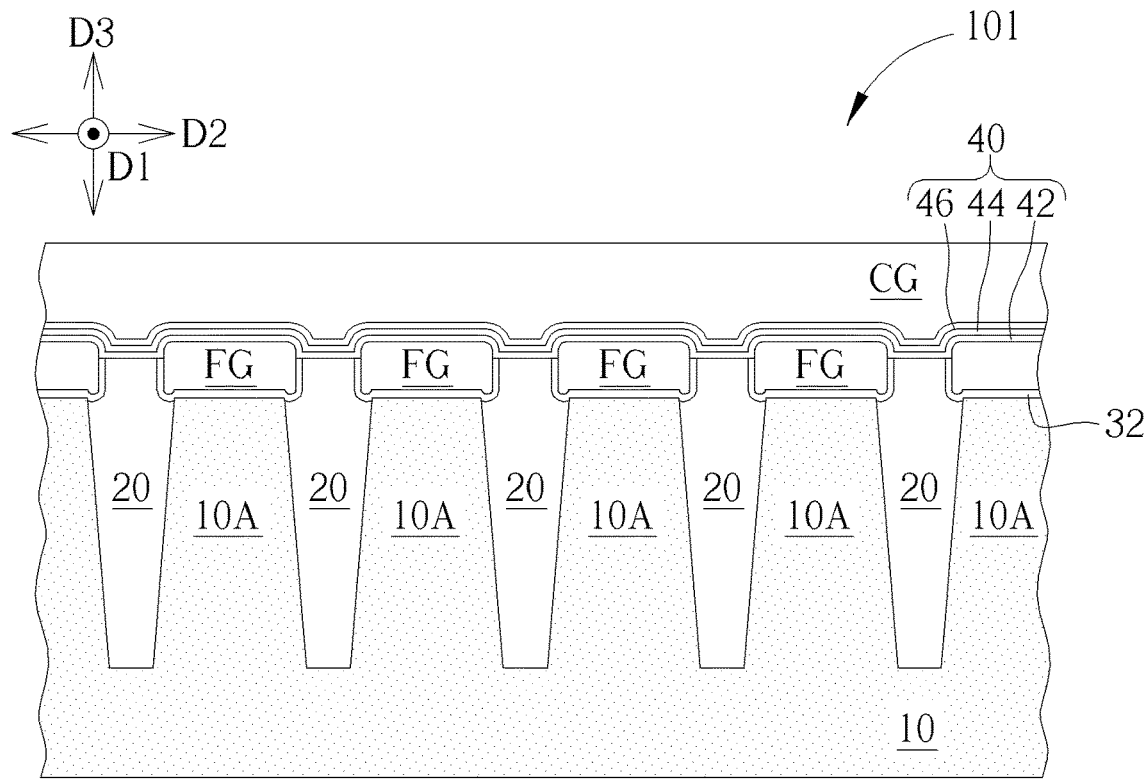
FIG. 2 is a cross-sectional diagram taken along a line A-A' in FIG. 1.

Please refer to FIG. 1 and FIG. 2. FIG. 1 is a schematic drawing illustrating a top view of a semiconductor memory device 101 according to a first embodiment of the present invention, and FIG. 2 is a cross-sectional diagram taken along a line A-A' in FIG. 1. As shown in FIG. 1 and FIG. 2, the semiconductor memory device 101 includes a substrate 10, a plurality of isolation structures 20, a plurality of floating gate electrodes FG, a plurality of control gate electrodes CG, a dielectric layer 32, and a memory layer 40. The substrate 10 may include a semiconductor substrate, such as a silicon substrate, an epitaxial silicon substrate, a silicon germanium substrate, a silicon carbide substrate, a silicon-on-insulator (SOI) substrate, or a semiconductor substrate of other suitable type. The isolation structure 20 may be a shallow trench isolation (STI) formed in the substrate 10 for defining a plurality of active regions 10A in the substrate 10. In other words, the active regions 10A may be a part of the substrate 10, and the material composition of the active region 10A is identical to the material composition of the substrate 10. The shallow trench isolation described above may be formed by forming a trench in the substrate 10 without penetrating through the substrate 10 and filling the trench with a single layer or multiple layers of insulation material (such as silicon oxide, silicon nitride, silicon oxynitride, silicon carbonitride, or other suitable insulation materials), but not limited thereto. In a top view diagram of the semiconductor memory device 101, each of the isolation structures 20 may be substantially elongated in a first direction D1, and each of the control gate electrodes CG may be substantially elongated in a second direction D2 and partly overlap more than one isolation structure 20 and more than one active region 10A in a thickness direction of the substrate 10 (such as a third direction D3 shown in FIG. 1 and FIG. 2). In some embodiments, the second direction D2 may be substantially perpendicular to the first direction D1, but not limited thereto. Each of the floating gate electrodes FG may be disposed between the control gate electrode CG and the active region 10A and located at a region where the control gate electrode CG overlaps the active region 10A in the third direction D3. The dielectric layer 32 may be disposed between each floating gate electrode FG and the corresponding active region 10A, and the memory layer 40 may be disposed between the control gate electrode CG and the corresponding floating gate electrode FG.

In some embodiments, the dielectric layer 32 may include silicon oxide, silicon oxynitride, or other suitable dielectric materials, the floating gate electrode FG and the control gate electrode CG may respectively include an electrically conductive material, such as a non-metallic conductive material (such as doped polysilicon), a metallic conductive material, or other suitable electrically conductive materials, and the memory layer 40 may include a charge storage structure composed of material layers, but not limited thereto. For example, in some embodiments, the memory layer 40 may include a first oxide layer 42, a nitride layer 44, and a second oxide layer 46 disposed in a stacked configuration. The first oxide layer 42 and the second oxide layer 46 may respectively include silicon oxide or other suitable oxide materials, the nitride layer 44 may include silicon nitride or other suitable nitride materials, and the memory layer 40 may be regarded as an oxide-nitride-oxide (ONO) structure, but not limited thereto.

In some embodiments, a manufacturing method of the floating gate electrodes FG may include but is not limited to the following steps. Firstly, a top portion of the isolation structure 20 may be higher than the active region 10 in the third direction D3 by modifying related processes. Subsequently, the dielectric layer 32 and an electrically conductive material used for forming the floating gate electrodes FG may be formed between the isolation structures 20 adjacent to each of other and formed on the active regions 10A. The memory layer 40 and an electrically conductive material used for forming the control gate electrodes CG may then be formed and a patterning process may be performed to the electrically conductive material and the memory layer 40 for forming the control gate electrodes CG. In some embodiments, the electrically conductive material used for forming the floating gate electrodes FG may be patterned to be the floating gate electrodes FG formed between the control gate electrode CG and the active region 10A by the patterning process mentioned above, but not limited thereto.

However, in some embodiments, the isolation structure 20 may have a curved edge at the end of the isolation structure 20 in the extending direction of the isolation structure 20 (such as the first direction D1) because of influence of manufacturing processes, and the shape of the floating gate electrode FG formed by the patterning process mentioned above may be influenced by the curved edge of the isolation structure 20 when there is an alignment deviation in the patterning process (such as the control gate electrode CG leaning towards the right side of FIG. 1). Accordingly, the spacing between the adjacent floating gate electrodes FG may become too small or a short circuit may be generated between the adjacent floating gate electrodes FG. The manufacturing yield of the semiconductor memory device 101 may be influenced by the issues described above, and it will be more difficult to manufacture because of the process window of each component will be relatively reduced as the memory cell of the semiconductor memory device has to be continuously scaled down in the design.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 3:
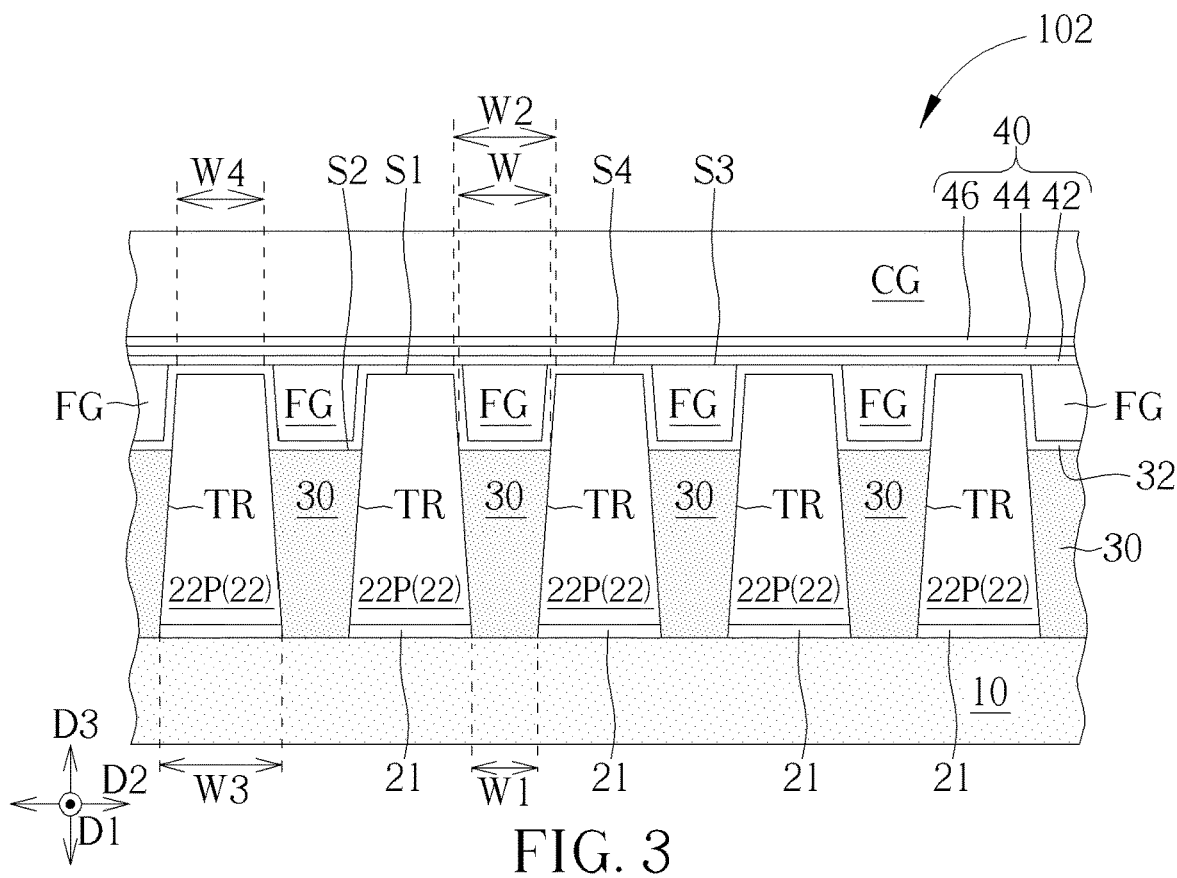
FIG. 3 is a schematic drawing illustrating a semiconductor memory device according to a second embodiment of the present invention.

Please refer to FIG. 3. FIG. 3 is a schematic drawing illustrating a semiconductor memory device 102 according to a second embodiment of the present invention. As shown in FIG. 3, the semiconductor memory device 102 includes the substrate 10, an isolation layer 22, a trench TR, a semiconductor active structure 30, and the floating gate electrode FG. The isolation layer 22 is disposed on the substrate 10. The trench TR penetrates through the isolation layer 22 and exposes a part of the substrate 10. The semiconductor active structure 30 is disposed in the trench TR. The floating gate electrode FG is disposed on the semiconductor active structure 30.

In this embodiment, the substrate 10 may include a semiconductor substrate, an insulation substrate, or a substrate made of other suitable materials. The semiconductor active structure 30 is disposed in the trench TR penetrating through the isolation layer 22 in the third direction D3, and the material composition of the semiconductor active structure 30 may be different from the material composition of substrate 10 accordingly. In some embodiments, the semiconductor active structure 30 may include a single layer or multiple layers of semiconductor materials, such as an amorphous silicon semiconductor material, a single-crystal silicon semiconductor material, a polysilicon semiconductor material, or other suitable types of semiconductor materials, and the isolation layer 22 may include a single layer or multiple layers of insulation materials, such as silicon oxide, silicon nitride, silicon oxynitride, silicon carbonitride, or other suitable insulation materials.

Additionally, in some embodiments, the semiconductor memory device 101 may further include an etching stop layer 21 disposed between the isolation layer 22 and the substrate 10, and the trench TR may further penetrate through the etching stop layer 21. The etching stop layer 21 may include nitride (such as silicon nitride) or other suitable materials different from the material of the isolation layer 22 and having required etching selectivity between the material of the etching stop layer 21 and the material of the isolation layer 22. In some embodiments, the trench TR may be formed by performing an etching process to the isolation layer 22 and the etching stop layer 21, and a top width of the trench TR (such as a width W2 shown in FIG. 3) may be greater than a bottom width of the trench TR (such as a width W1 shown in FIG. 3) because of being affected by the characteristics of the etching process, but not limited thereto. In some embodiments, the third direction D3 described above may be regarded as a thickness direction of the substrate 10, and a horizontal direction (such as the first direction D1 and the second direction D2) substantially orthogonal to the third direction D3 may be parallel with a surface of the substrate, but not limited thereto. Additionally, in this description, a distance between the substrate 10 and a relatively higher location and/or a relatively higher part in the third direction D3 is greater than a distance between the substrate 10 and a relatively lower location and/or a relatively lower part in the third direction D3. The bottom of each part may be closer to the substrate 10 in the third direction D3 than the top of this part. Another part disposed above a specific part may be regarded as being relatively far from the substrate 10 in the third direction D3, and another part disposed under a specific part may be regarded as being relatively closer to the substrate 10 in the third direction D3.

In some embodiments, a top surface of the semiconductor active structure 30 (such as a top surface S2 shown in FIG. 3) may be lower than a top surface of the isolation layer 22 (such as a top surface S1 shown in FIG. 3) in the thickness direction of the substrate 10 (such as the third direction D3), and a distance between the top surface S2 of the semiconductor active structure 30 and the substrate 10 in the third direction D3 may be less than a distance between the top surface S1 of the isolation layer 22 and the substrate 10 in the third direction D3, but not limited thereto. In addition, the floating gate electrode FG may be disposed on the semiconductor active structure 30 and at least partially located in the trench TR. In some embodiments, the semiconductor active structure 30 disposed in the trench TR may directly contact the isolation layer 22 and the etching stop layer 21, and the shape of the semiconductor active structure 30 is influenced by the shape of the trench TR accordingly, but not limited thereto. For instance, a top width of the semiconductor active structure 30 (such as a width W shown in FIG. 3) may be greater than a bottom width of the semiconductor active structure 30 (such as the width W1 shown in FIG. 3) also, the top width of the semiconductor active structure 30 may be slightly less than the top width of the trench TR, and the bottom width of the semiconductor active structure 30 may be substantially equal to the bottom width of the trench TR, but not limited thereto.

Additionally, in some embodiments, the isolation layer 22 may be divided into a plurality of isolation blocks 22P separated from one another by the trench TR. Each of the isolation blocks 22P may be surrounded by the trench TR in the horizontal direction (such as the first direction D1 and the second direction D2), and a top width of each of the isolation blocks 22P (such as a width W4 shown in FIG. 3) may be less than a bottom width of each of the isolation blocks 22P (such as a width W3 shown in FIG. 3). In other words, each of the isolation blocks 22P may have a structure with a narrower top and a wider bottom, and the semiconductor active structure 30 and the trench TR may respectively have a structure with a wider top and a narrower bottom, but not limited thereto In some embodiments, the semiconductor memory device 102 may further include the dielectric layer 32, the memory layer 40, and the control gate electrode CG. The dielectric layer 32 may be disposed between the floating gate electrode FG and the semiconductor active structure 30 and may be at least partially disposed in the trench TR, the memory layer 40 may be disposed on the floating gate electrode FG and the dielectric layer 32, and the control gate electrode CG may be disposed on the memory layer 40. In some embodiments, the dielectric layer 32 may be partly disposed on the isolation layer 22, and a top surface of the floating gate electrode FG (such as a top surface S3 shown in FIG. 3) and a top surface of the dielectric layer 32 (such as a top surface S4 shown in FIG. 3) may be substantially coplanar, but not limited thereto. It is worth noting that, in some embodiments, the top surface S1, the top surface S2, the top surface S3, and the top surface S4 described above may be the topmost surface of the isolation layer 22, the topmost surface of the semiconductor active structure 30, the topmost surface of the floating gate electrode FG, and the topmost surface of the dielectric layer 32 in the third direction D3 respectively, but not limited thereto. It is worth noting that, in some embodiments, the material composition of the dielectric layer 32 may be identical to the material composition of the isolation layer 22, the dielectric layer 32 connected with the isolation blocks 22P may be merged with the isolation blocks 22P, and there will be not any obvious interface between the dielectric layer 32 and the isolation block 22P. Therefore, the topmost portion of the isolation block 22P (i.e. the portion where the dielectric layer 32 and the isolation block 22P are merged into one object) may become wider, and each of the isolation blocks 22P may have a structure with a wider top, a wider bottom, and a narrower center, but not limited thereto.

The semiconductor active structure 30 is disposed in the trench TR penetrating through the isolation layer 22 and the floating gate electrode FG is disposed on the semiconductor active structure 30 for avoiding the influence of the edge shape of the isolation layer 22 on the floating gate electrodes FG and the short circuit between the adjacent floating gate electrodes FG. The process window may be improved and the manufacturing yield may be enhanced accordingly.

Figure 4:
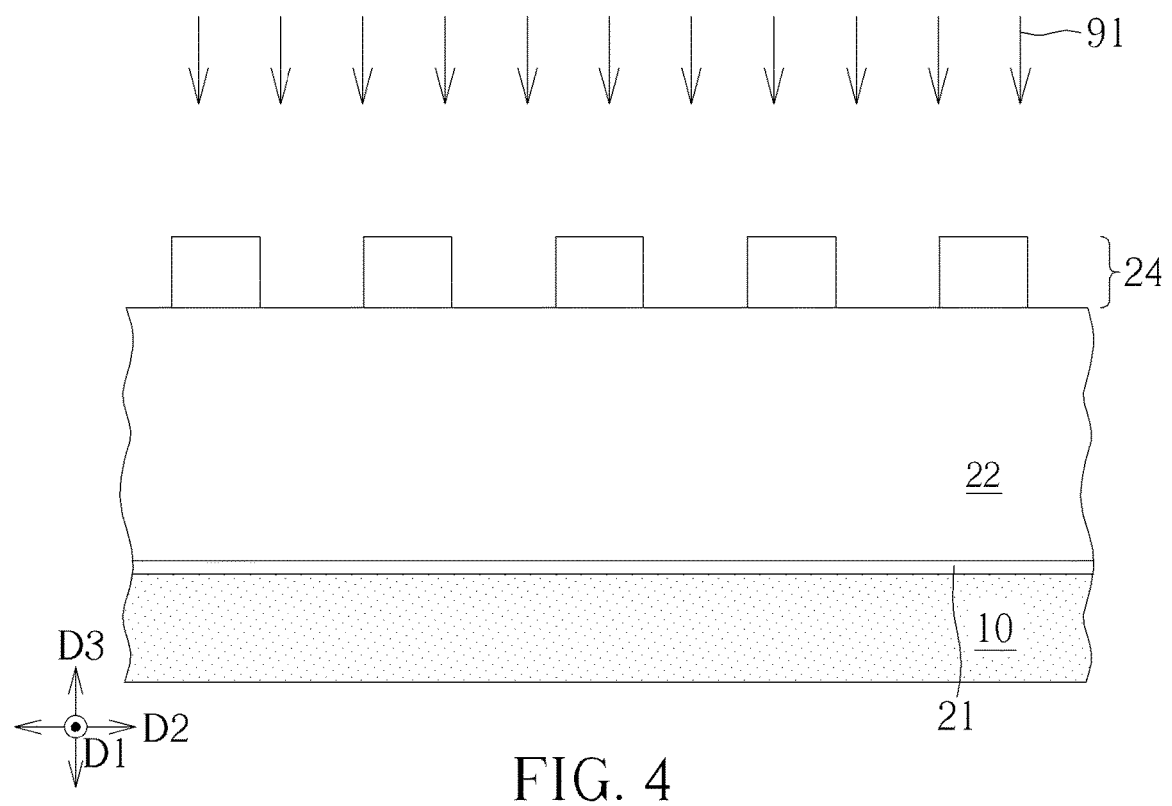
Figure 5:
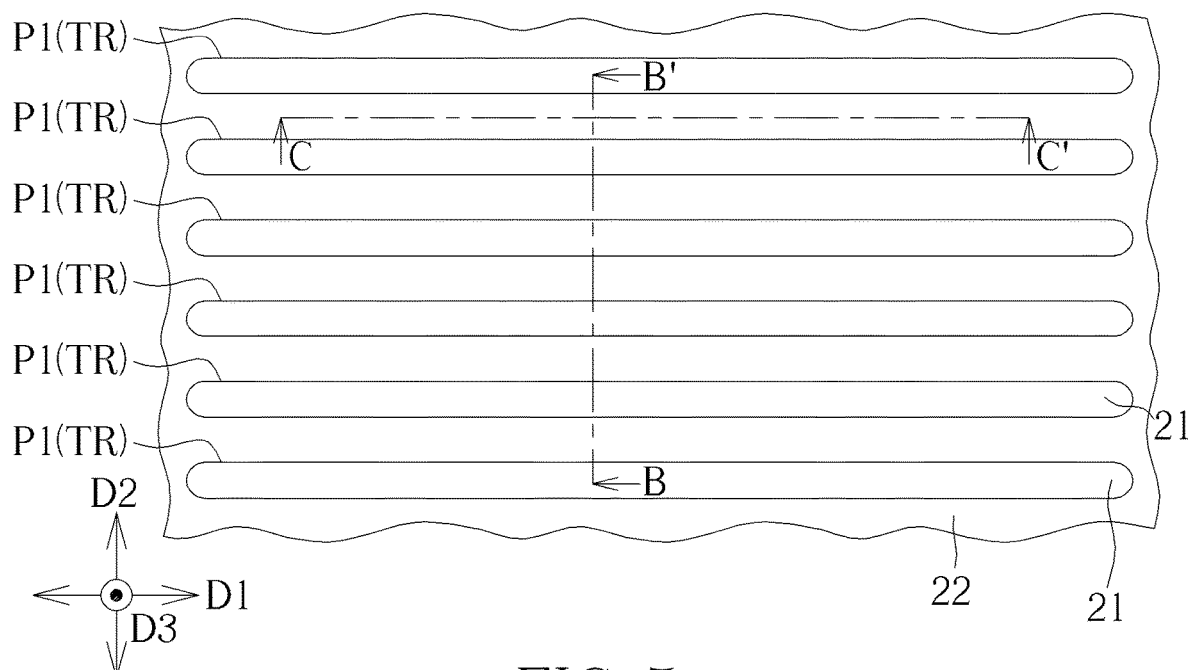
Figure 6:
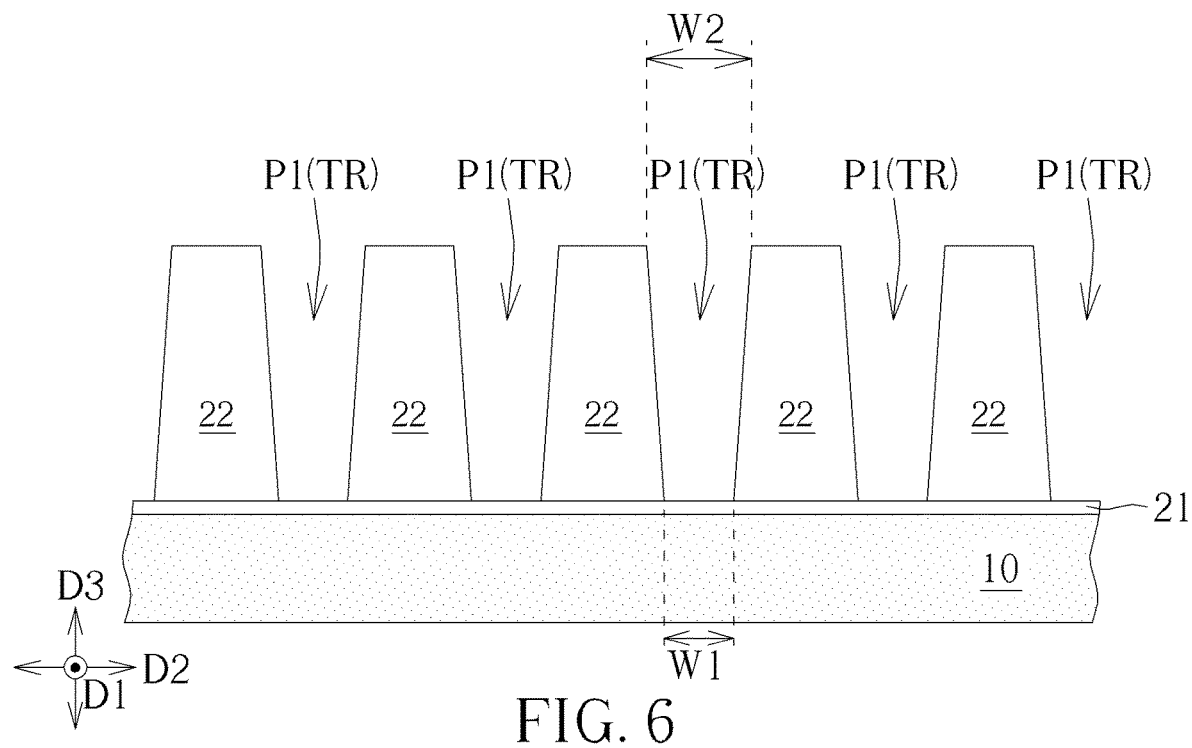
Figure 7:
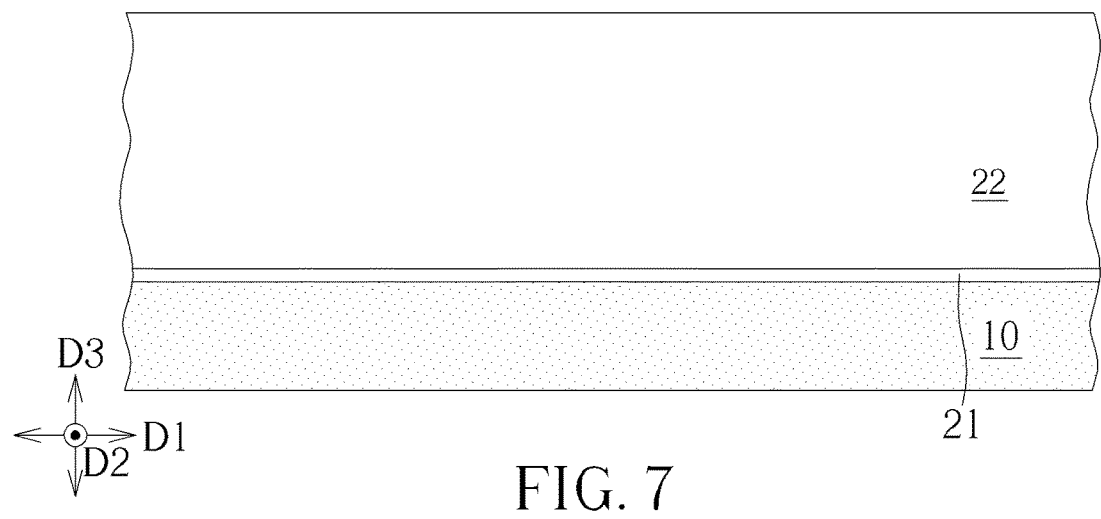
Figure 8:
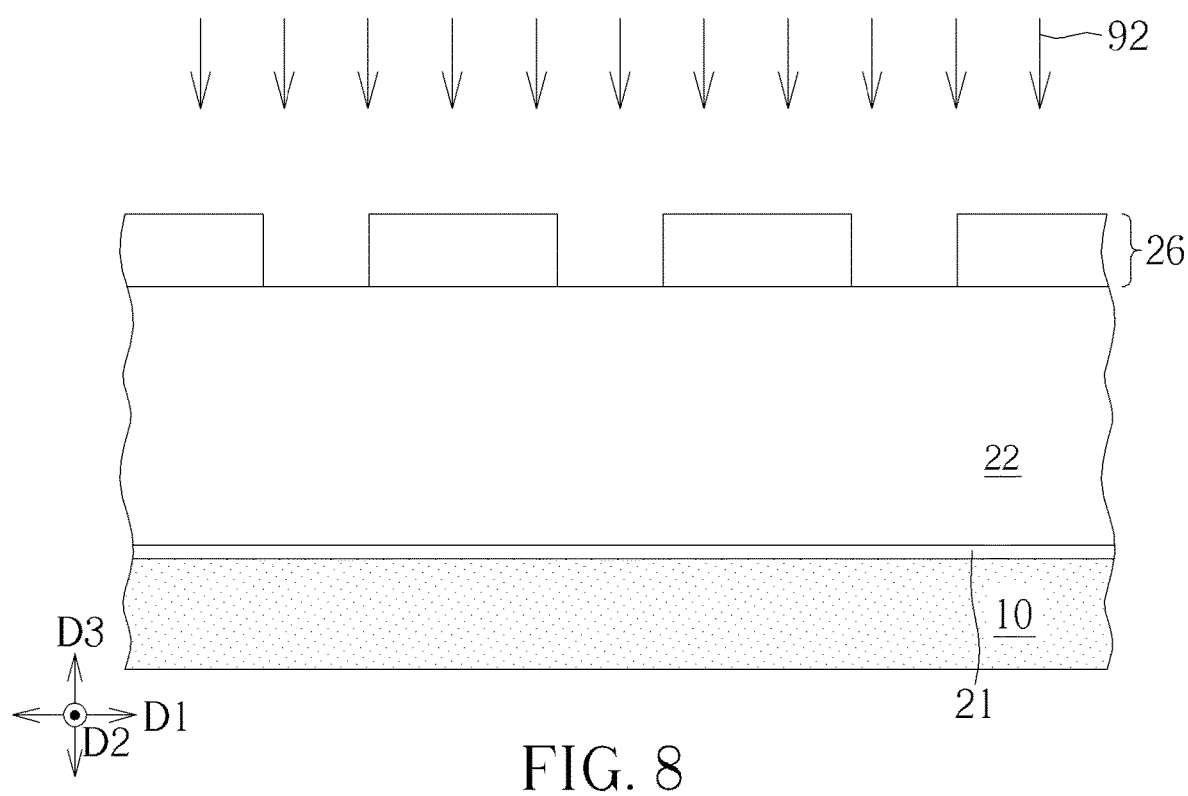
Figure 9:
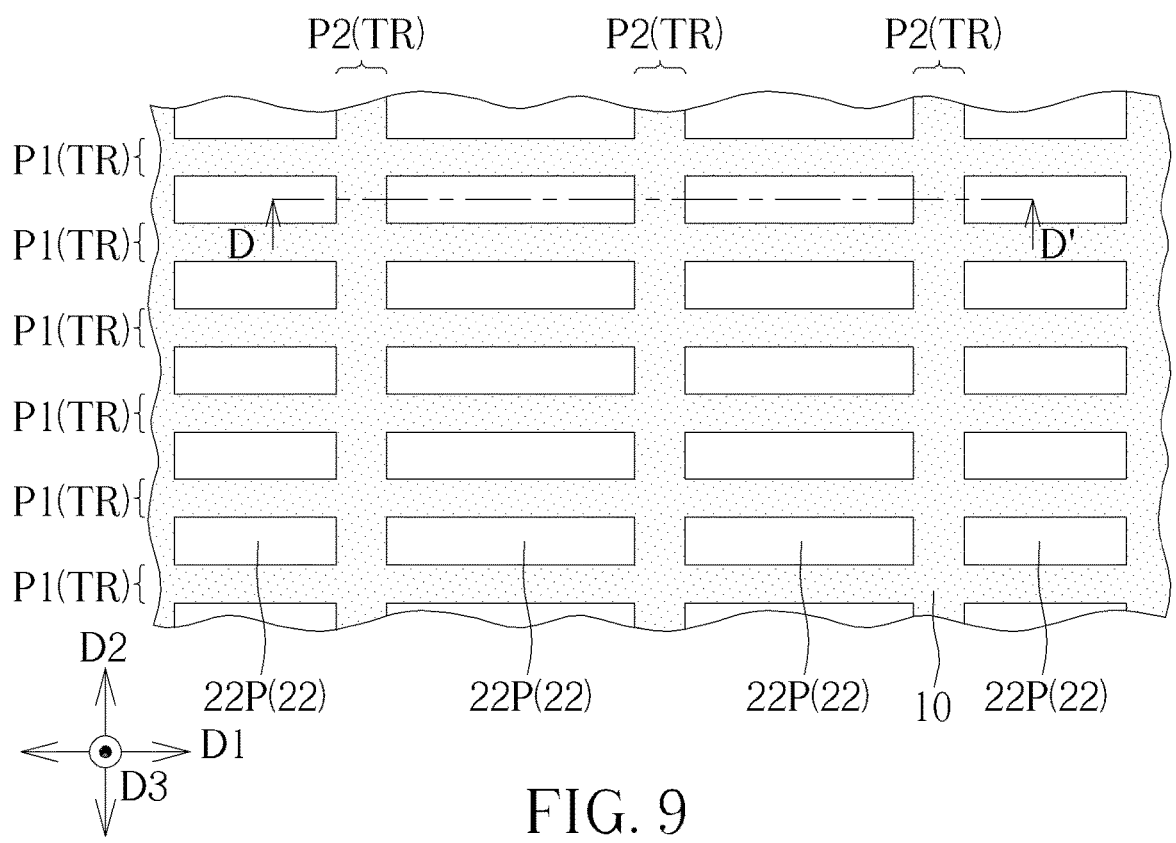
Figure 10:
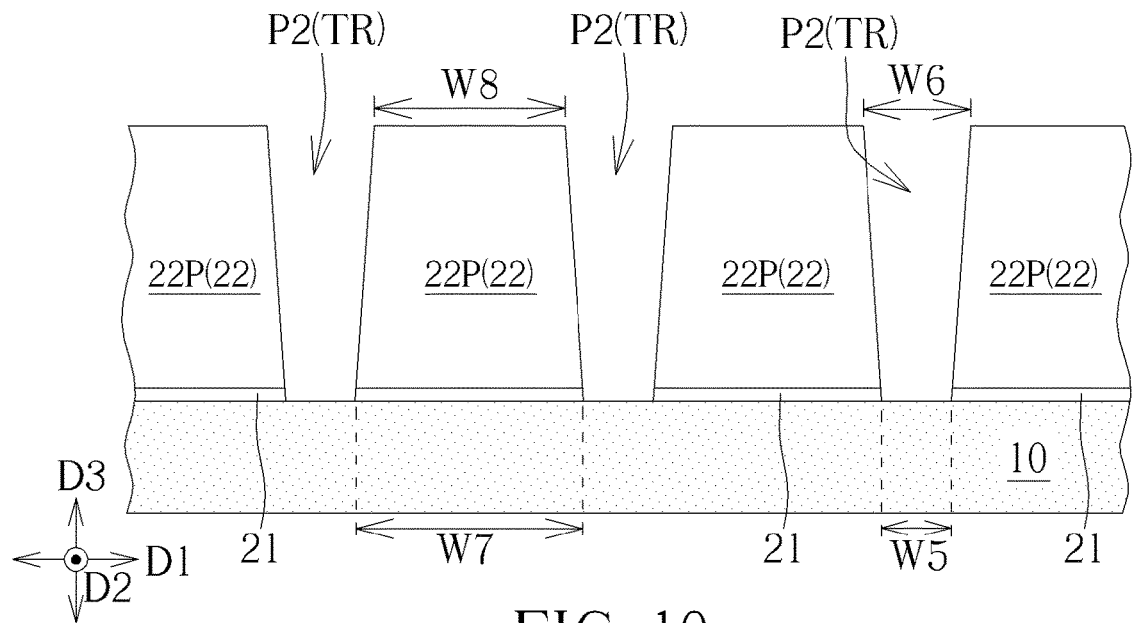
Figure 11:
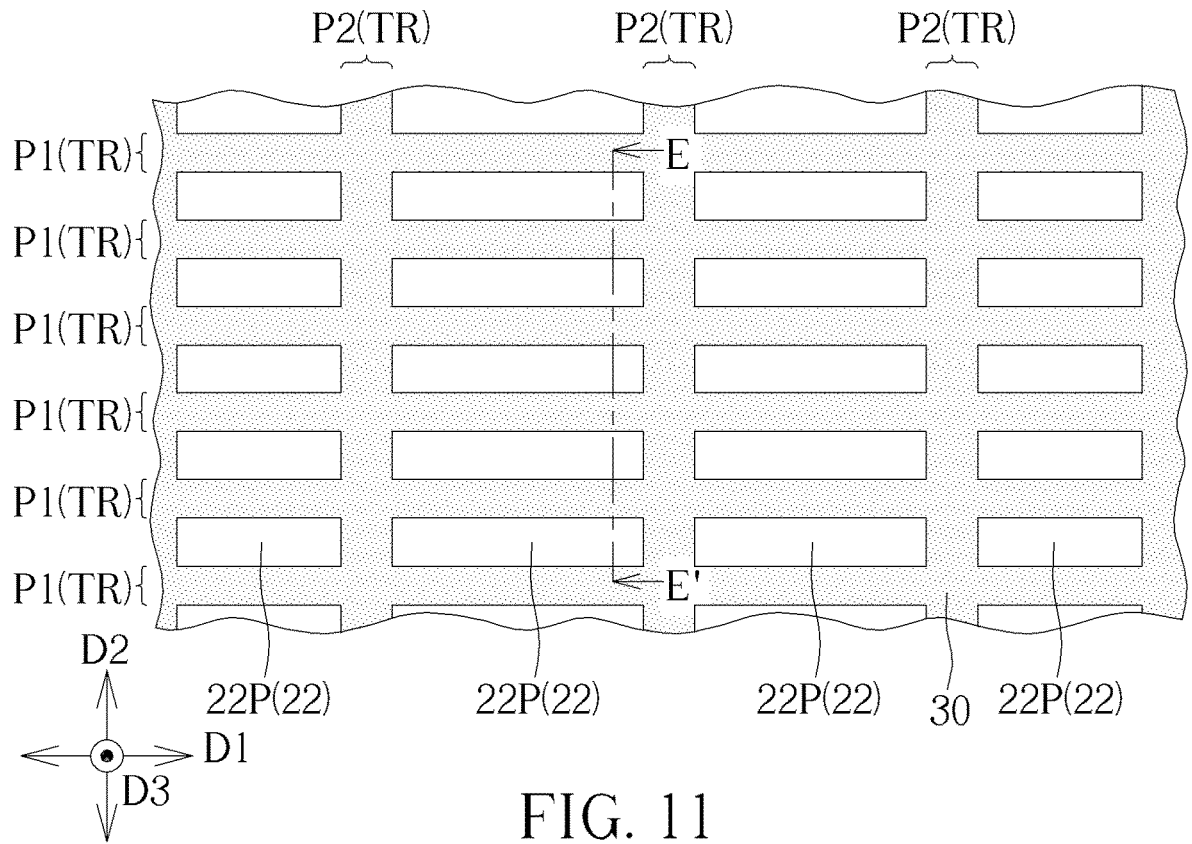
Figure 12:
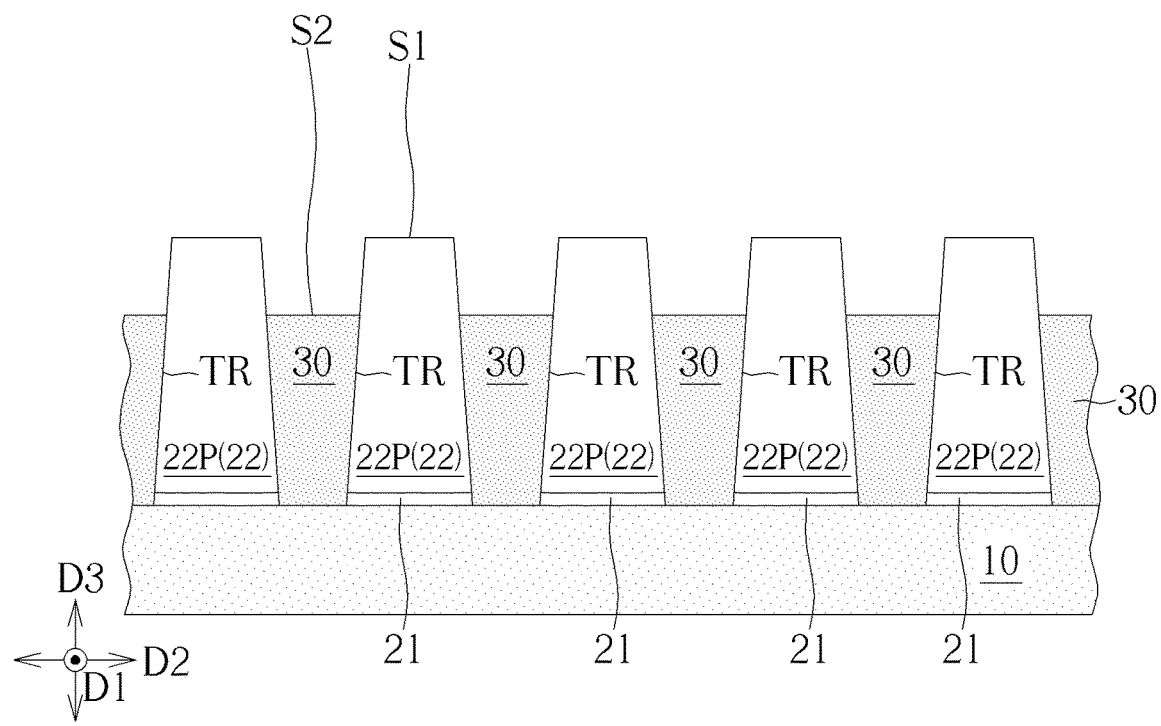
Figure 13:
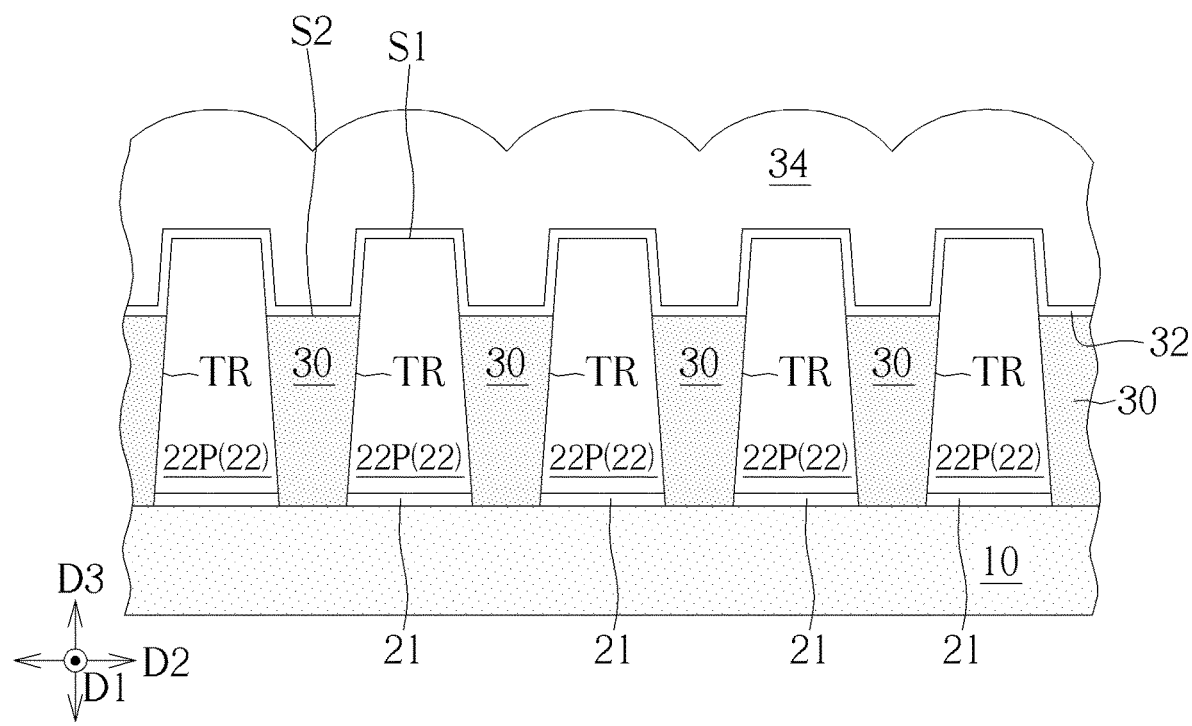
Figure 14:
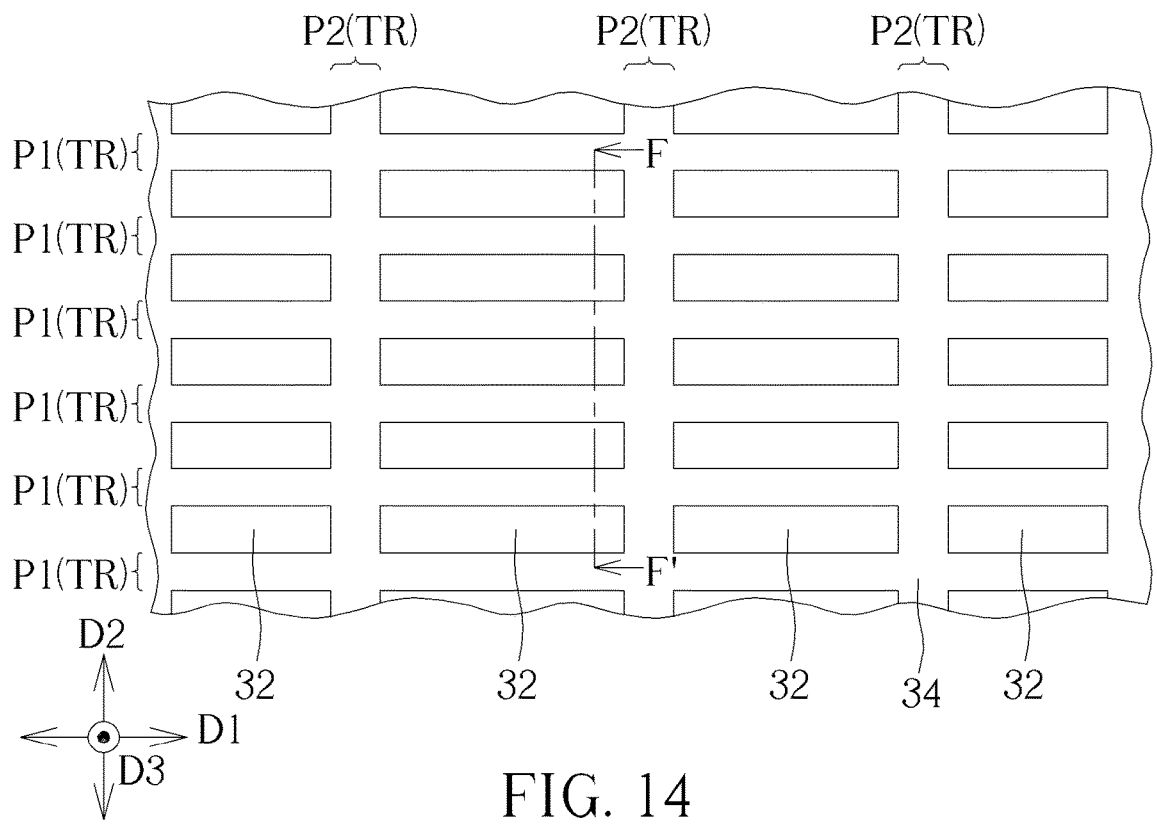
Figure 15:
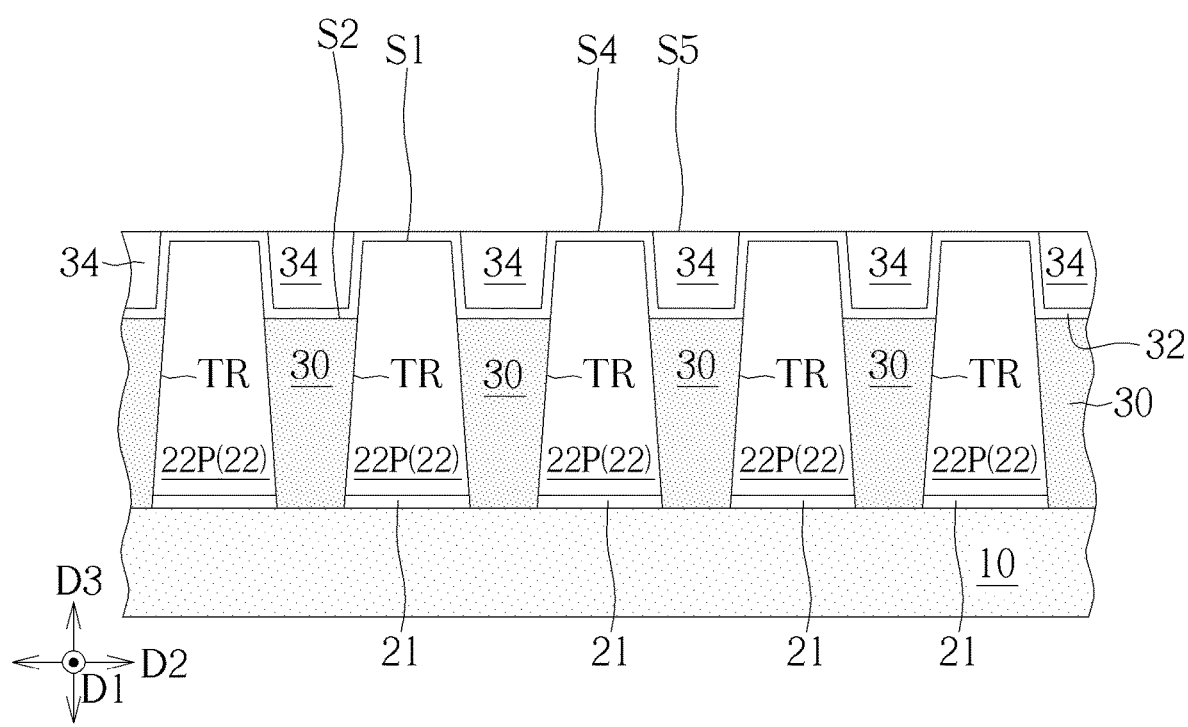
Figure 16:
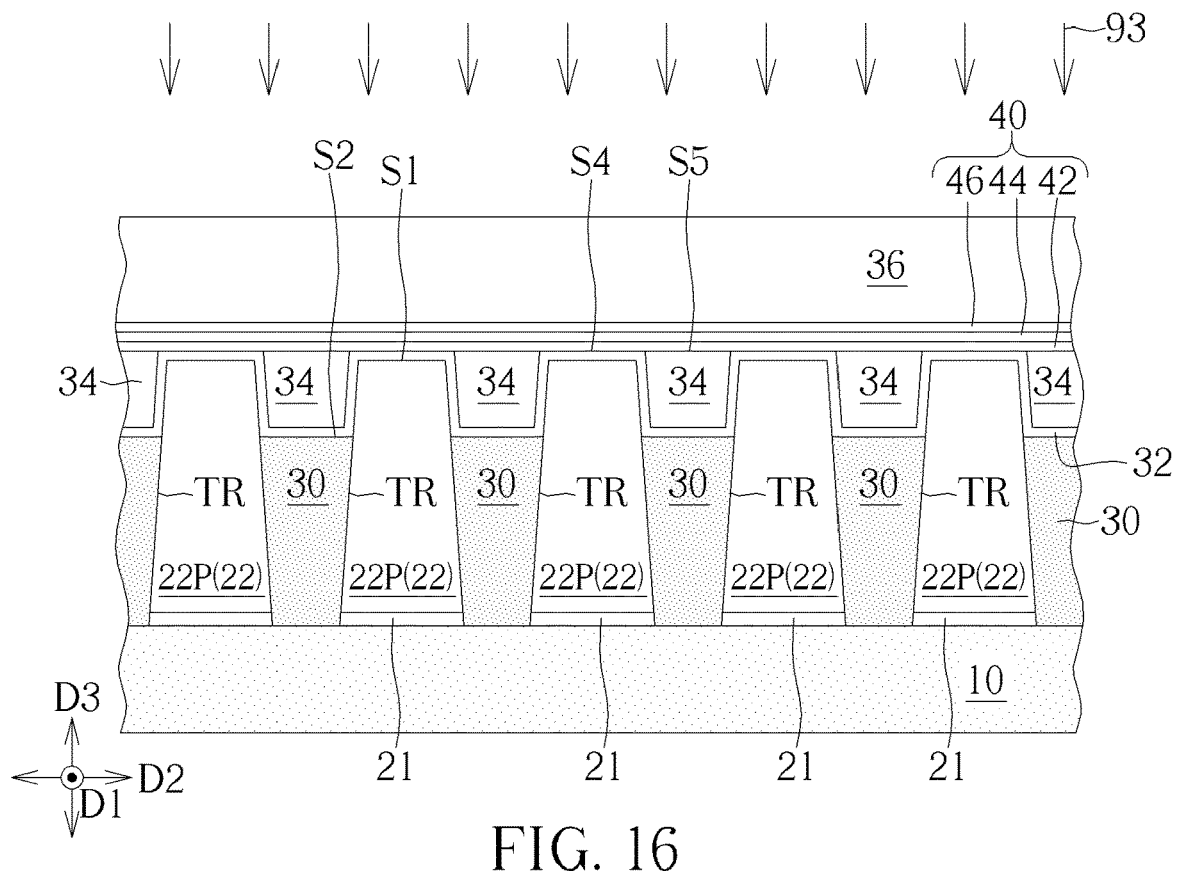
Figure 17:
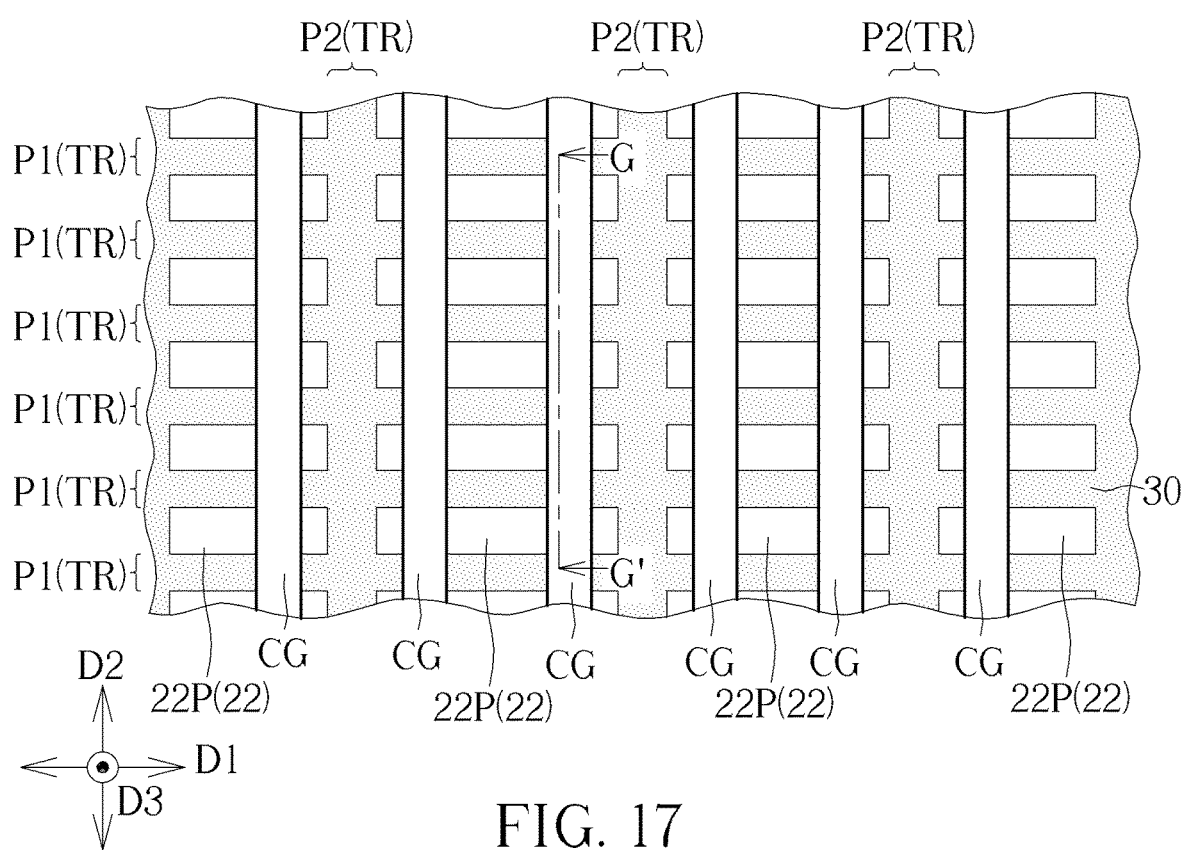

Please refer to FIGS. 3-17. FIGS. 4-17 are schematic drawings illustrating a manufacturing method of the semiconductor memory device 102 in this embodiment, wherein FIG. 5 is a schematic drawing in a step subsequent to FIG. 4, FIG. 6 is a cross-sectional diagram taken along a line B-B' in FIG. 5, FIG. 7 is a cross-sectional diagram taken along a line C-C' in FIG. 5, FIG. 8 is a schematic drawing in a step subsequent to FIG. 7, FIG. 9 is a schematic drawing in a step subsequent to FIG. 8, FIG. 10 is a cross-sectional diagram taken along a line D-D' in FIG. 9, FIG. 11 is a schematic drawing in a step subsequent to FIG. 9, FIG. 12 is a cross-sectional diagram taken along a line E-E' in FIG. 11, FIG. 13 is a schematic drawing in a step subsequent to FIG. 12, FIG. 14 is a schematic drawing in a step subsequent to FIG. 13, FIG. 15 is a cross-sectional diagram taken along a line F-F' in FIG. 14, FIG. 16 is a schematic drawing in a step subsequent to FIG. 14, FIG. 17 is a schematic drawing in a step subsequent to FIG. 16, and FIG. 3 may be regarded as a cross-sectional diagram taken along a line G-G' in FIG. 17. As shown in FIG. 3, the manufacturing method of the semiconductor memory device 102 may include the following steps. Firstly, the isolation layer 22 is formed on the substrate 10. The trench TR is formed penetrating through the isolation layer 22 and exposing a part of the substrate 10. The semiconductor active structure 30 is formed in the trench TR. The floating gate electrode FG is formed on the semiconductor active structure 30.

Specifically, the manufacturing method of the semiconductor memory device 102 in this embodiment may include but is not limited to the following steps. As shown in FIGS. 4-7, the isolation layer 22 may be formed on the substrate 10, and a first patterned mask layer 24 may be formed on the isolation layer 22. Subsequently, a first etching process 91 with the first patterned mask layer 24 as an etching mask may be performed for forming first portions P1 of the trench TR, and the first patterned mask layer 24 may be removed after the first etching process 91. In some embodiments, the etching stop layer 21 may be formed on the substrate 10 before the step of forming the isolation layer 22, and the isolation layer 22 may be formed on the etching stop layer 21 accordingly. In addition, the first etching process 91 described above may stop at the etching stop layer 21, and the first portions P1 of the trench TR may penetrate through the isolation layer 22 in the third direction D3 without penetrating through the etching stop layer 21 yet after the first etching process 91 for protecting the substrate 10, but not limited thereto. As shown in FIGS. 5-7, the trench TR may include a plurality of the first portions P1, each of the first portions P1 may be elongated in the first direction D1, and the first portions P1 may be disposed repeatedly in the second direction D2, but not limited thereto. In some embodiments, the first etching process 91 may include a dry etching process or other suitable etching approaches, and a top width of each of the first portions P1 (such as the width W2 shown in FIG. 6) may be greater than a bottom width of each of the first portions P1 (such as the width W1 shown in FIG. 6) because of the influence of the characteristics of the etching process, but not limited thereto.

Subsequently, as shown in FIGS. 8-10, a second patterned mask layer 26 may be formed on the isolation layer 22, and a second etching process 92 with the second patterned mask layer 26 as an etching mask may be performed to the isolation layer 22 and the etching stop layer 21 for forming second portions P2 of the trench TR described above, and the second patterned mask layer 26 may be removed after the second etching process 92. In other words, the trench TR may include a plurality of the first portions P1 and a plurality of the second portions P2. The first portions P1 may be formed by the first etching process described above, the second portions P2 may be formed by the second etching process 92, and the second etching process 92 may be performed after the first etching process. Additionally, in some embodiments, the second etching process 92 may include a dry etching process or other suitable etching approaches, and a top width of each of the second portions P2 (such as a width W6 shown in FIG. 10) may be greater than a bottom width of each of the second portions P2 (such as a width W5 shown in FIG. 10) because of the influence of the characteristics of the etching process, but not limited thereto. Additionally, in some embodiments, the second etching process 92 may include a first etching process and a second etching process performed after the first etching process. The first etching step may be used to etch the isolation layer 22 for forming the second portions P2 of the trench TR, and the first etching step may stop at the etching stop layer 21. The second etching step may be used to etch the etching stop layer 21 exposed by the first portions P1 and the second portions P2 of the trench TR, and the first portions P1 and the second portions P2 of the trench TR may extend downwardly and penetrate through the etching stop layer 21 respectively for exposing a part of the substrate 10. In other words, the process condition of the second etching step may be different from the process condition of the first etching step for reducing the negative influence of the second etching process 92 on the substrate 10.

As shown in FIG. 9 and FIG. 10, each of the second portions P2 may be elongated in the second direction D2, the second portions P2 may intersect the first portions P1, and the first portions P1 and the second portions P2 may be connected with one another. Additionally, the isolation layer 22 may be divided into a plurality of the isolation blocks 22P separated from one another by the first portions P1 and the second portions P2 of the trench TR, each of the isolation blocks 22P may be surrounded by the first portions P1 and the second portions P2 of the trench TR in the horizontal direction (such as the first direction D1 and the second direction D2), and a top width of each of the isolation blocks 22P (such as a width W8 shown in FIG. 10) may be less than a bottom width of each of the isolation blocks 22P (such as a width W7 shown in FIG. 10), but not limited thereto.

Subsequently, as shown in FIG. 11 and FIG. 12, the semiconductor active structure 30 may be formed in the trench TR. In some embodiments, the semiconductor active structure 30 may be formed in the trench TR by a deposition process, an epitaxial growth process, or other suitable approaches, and the semiconductor active structure 30 may directly contact the substrate 10 accordingly, but not limited thereto. Additionally, in some embodiments, the top surface S2 of the semiconductor active structure 30 may be lower than the top surface S1 of the isolation layer 22 in the third direction D3 by modifying the process condition of the process configured to form the semiconductor active structure 30 and/or performing an etching back process to the semiconductor active structure 30, but not limited thereto.

As shown in FIG. 13, the dielectric layer 32 may be conformally formed on the isolation layer 22 and the semiconductor active structure 30, and a first material layer 34 may be formed on the dielectric layer 32. The first material layer 34 may be used to be patterned to be the floating gate electrodes described above, and the first material layer 34 may include an electrically conductive material, such as a non-metallic conductive material (such as doped polysilicon), a metallic conductive material, or other suitable electrically conductive materials. In some embodiments, the remaining space in the trench TR may be filled with the first material layer 34 and a part of the first material layer 34 may be formed outside the trench TR, but not limited thereto. Subsequently, as shown in FIGS. 13-15, a part of the first material layer 34 may be removed for exposing a part of the dielectric layer 32 by a planarization process. The planarization process may include a chemical mechanical polishing (CMP) process, an etching back process, or other suitable planarization approaches. In some embodiments, the dielectric layer 32 may be used as a stop layer in the planarization process described above, and the top surface S4 of the dielectric layer 32 and a top surface S5 of the first material layer 34 may be substantially coplanar after the planarization process, but not limited thereto.

As shown in FIG. 16, the memory layer 40 may be fully formed on the first material layer 34 and the dielectric layer 32, and a second material layer 36 may be formed on the memory layer 40. The second material layer 36 may be used to be patterned to be the control gate electrodes described above, and the second material layer 36 may include an electrically conductive material, such as a non-metallic conductive material (such as doped polysilicon), a metallic conductive material, or other suitable electrically conductive materials. Subsequently, as shown in FIG. 16, FIG. 17, and FIG. 3, a patterning process 93 may be performed to the second material layer 36 and the memory layer 40 for forming a plurality of the control gate electrodes CG and the memory layer 40 underneath the control gate electrodes CG. The patterning process 93 may include a photolithography process or other suitable patterning approaches. Additionally, in some embodiments, the first material layer 34 may be patterned by the patterning process 93 also for forming the floating gate electrodes FG at the areas where the control gate electrodes CG overlap the semiconductor active structure 30 in the third direction D3 and located between the semiconductor active structure 30 and the control gate electrodes CG, but not limited thereto.

In the manufacturing method in this embodiment, curved edges are less likely to be formed at ends of each of the isolation blocks 22P in the extending direction of the isolation block 22P (such as the first direction D1) because the isolation layer 22 may be divided into the isolation blocks 22P by the first portions P1 and the second portions P2 with different extending directions in the trench TR, the process window of the patterning process 93 configured to form the control gate electrodes CG and the floating gate electrodes FG may be improved accordingly, and the manufacturing yield may be enhanced.

Figure 18:
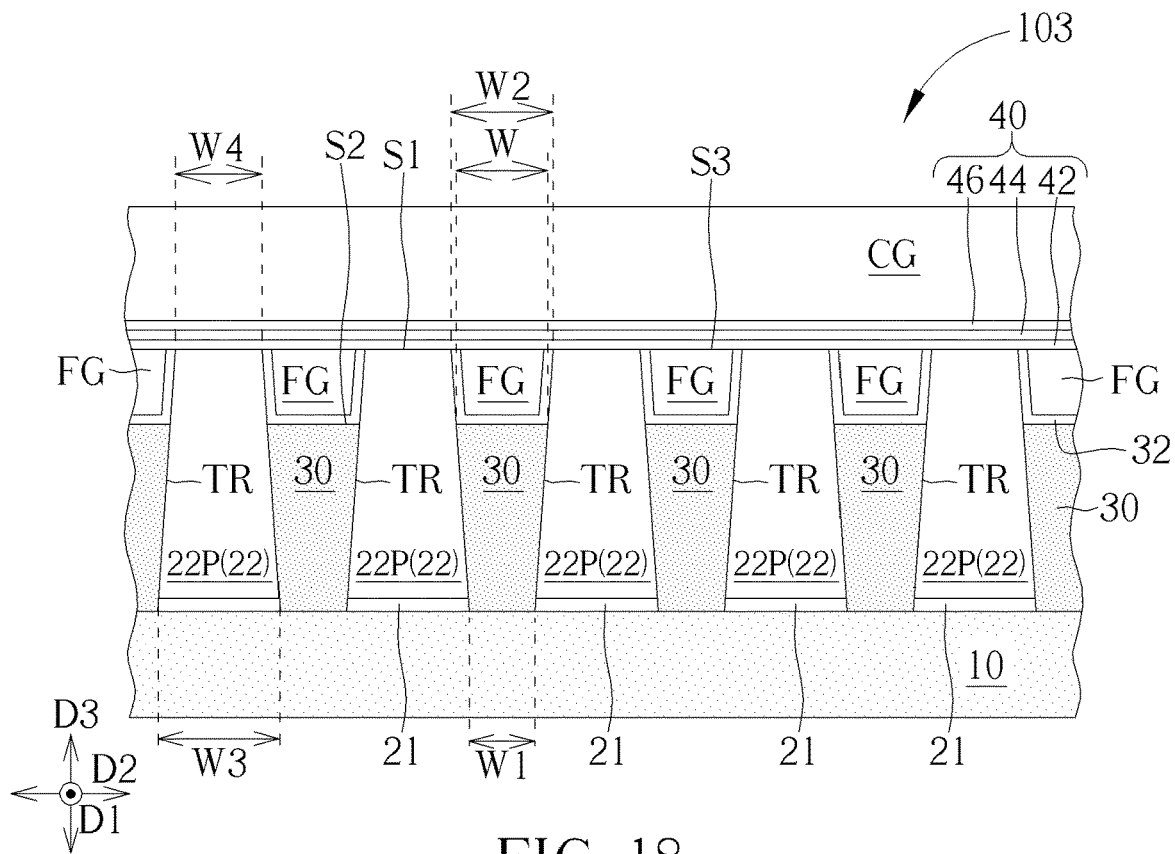
FIG. 18 is a schematic drawing illustrating a semiconductor memory device according to a third embodiment of the present invention.

Please refer to FIG. 18. FIG. 18 is a schematic drawing illustrating a semiconductor memory device 103 according to a third embodiment of the present invention. As shown in FIG. 18, the difference between the semiconductor memory device 103 and the semiconductor memory device in the second embodiment described above is that the top surface S3 of the floating gate electrode FG and the top surface S1 of the isolation layer 22 in the semiconductor memory device 103 may be substantially coplanar, and the memory layer 40 may directly contact the floating gate electrode FG, the dielectric layer 32, and the isolation layer 22 accordingly, but not limited thereto. In the manufacturing method of the semiconductor memory device 103, the dielectric layer 32 located on the top surface S1 of the isolation layer 22 may be removed by a planarization process performed to the first material layer used for forming the floating gate electrodes FG (such as the condition shown in FIG. 15), and the top surface S3 of the floating gate electrode FG and the top surface S1 of the isolation layer 22 accordingly, but not limited thereto. The thickness of the dielectric layer located between the control gate electrode CG and the semiconductor active structure 30 may be reduced by removing the dielectric layer 32 on the isolation layer 22, and that will be beneficial to the performance of the semiconductor memory device 103.

Figure 19:
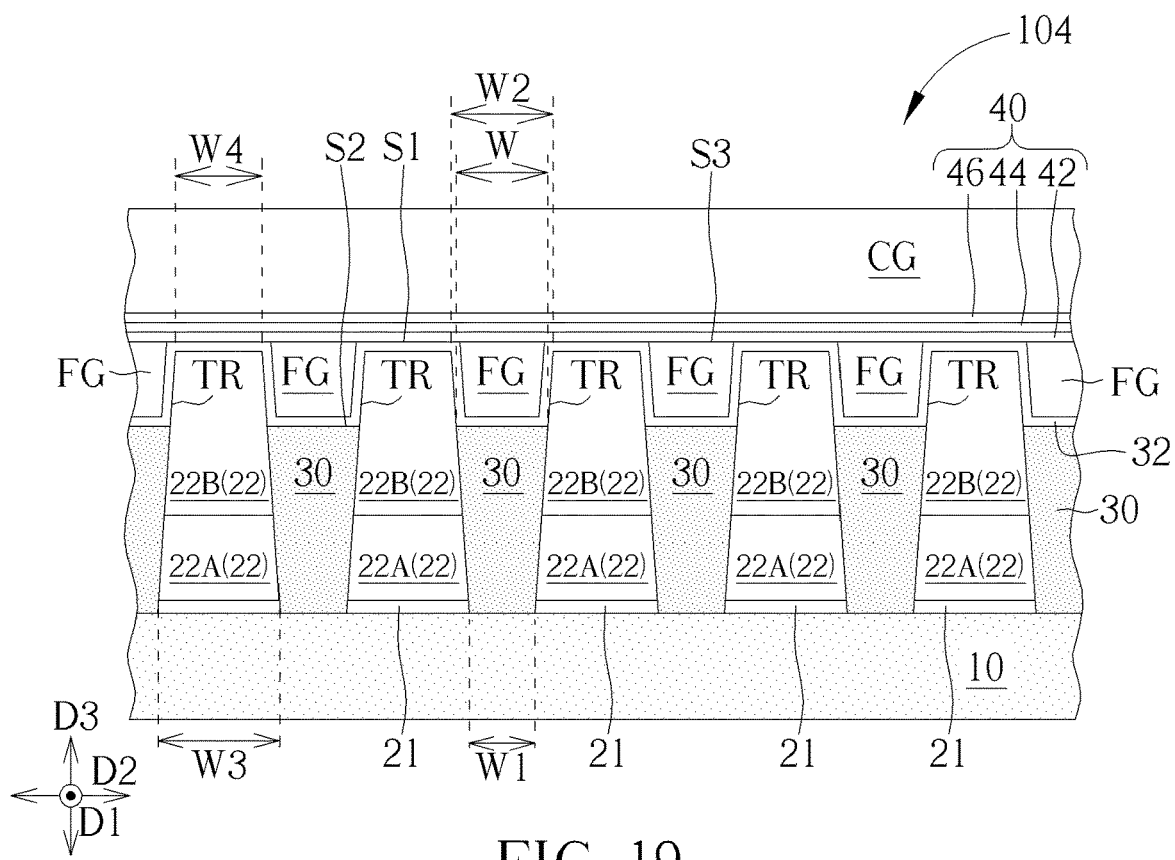
FIG. 19 is a schematic drawing illustrating a semiconductor memory device according to a fourth embodiment of the present invention.

Please refer to FIG. 19. FIG. 19 is a schematic drawing illustrating a semiconductor memory device 104 according to a fourth embodiment of the present invention. As shown in FIG. 19, in the semiconductor memory device 104, the isolation layer 22 may include a first layer 22A and a second layer 22B. The second layer 22B may be disposed on the first layer 22A, and a material composition of the first layer 22A may be different from a material composition of the second layer 22B. For example, the dielectric constant of the second layer 22B may be lower than the dielectric constant of the first layer 22A for enhancing the isolation performance at the upper portion of the isolation layer 22, but not limited thereto. In addition, the semiconductor active structure 30 may directly contact a sidewall of the first layer 22A of the isolation layer 22, a sidewall of the second layer 22B of the isolation layer 22, and a sidewall of the etching stop layer 21 because the semiconductor active structure 30 is formed in the trench TR penetrating through the second layer 22B, the first layer 22A, and the etching stop layer 21, but not limited thereto. It is worth noting that the isolation layer 22 with a multilayer structure in this embodiment may also be applied to other embodiments of the present invention according to other design considerations.

To summarize the above descriptions, in the semiconductor memory device and the manufacturing method thereof according to the present invention, the semiconductor active structure may be formed in the trench penetrating through the isolation layer, the isolation blocks may be formed by dividing the isolation layer with the trench, and the curved edge is less likely to be formed at the end of the isolation block in the extending direction thereof accordingly. Therefore, the process window of the patterning process configured to form the control gate electrodes and the floating gate electrodes may be improved, and the manufacturing yield may be enhanced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor memory device, comprising:
   forming an isolation layer on a substrate;
   forming a trench penetrating through the isolation layer and exposing a part of the substrate;
   forming a semiconductor active structure in the trench, wherein the semiconductor active structure directly contacts the isolation layer; and
   forming a floating gate electrode on the semiconductor active structure.

2. The manufacturing method of the semiconductor memory device according to claim 1, wherein the trench comprises:
   first portions, wherein each of the first portions is elongated in a first direction; and
   second portions, where each of the second portions is elongated in a second direction, and the second portions intersect the first portions.

3. The manufacturing method of the semiconductor memory device according to claim 2, wherein the first portions are formed by a first etching process, and the second portions are formed by a second etching process performed after the first etching process.

4. The manufacturing method of the semiconductor memory device according to claim 2, wherein the isolation layer comprises at least one isolation block surrounded by the first portions and the second portions of the trench, and a top width of the at least one isolation block is less than a bottom width of the at least one isolation block.

5. The manufacturing method of the semiconductor memory device according to claim 2, wherein a top width of each of the first portions is greater than a bottom width of each of the first portions.

6. The manufacturing method of the semiconductor memory device according to claim 2, wherein a top width of each of the second portions is greater than a bottom width of each of the second portions.

7. The manufacturing method of the semiconductor memory device according to claim 1, wherein a top width of the semiconductor active structure is greater than a bottom width of the semiconductor active structure.

8. The manufacturing method of the semiconductor memory device according to claim 1, wherein a top surface of the semiconductor active structure is lower than a top surface of the isolation layer in a thickness direction of the substrate.

9. The manufacturing method of the semiconductor memory device according to claim 1, wherein a top surface of the floating gate electrode and a top surface of the isolation layer are coplanar.

10. The manufacturing method of the semiconductor memory device according to claim 1, further comprising:
    forming an etching stop layer on the substrate before the step of forming the isolation layer, wherein the trench further penetrates through the etching stop layer.

* * * * *